United States Patent
Zhang et al.

(10) Patent No.: US 9,826,664 B2
(45) Date of Patent: Nov. 21, 2017

(54) APPARATUS FOR COOLING SERVER CABINET, SERVER CABINET APPARATUS, AND INTERNET DATA CENTER

(71) Applicant: TENCENT TECHNOLOGY (SHENZHEN) COMPANY LIMITED, Shenzhen (CN)

(72) Inventors: Haitao Zhang, Shenzhen (CN); Xiaowei Yang, Shenzhen (CN); Hua Zhu, Shenzhen (CN); Jiebing Xia, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 112 days.

(21) Appl. No.: 14/831,762

(22) Filed: Aug. 20, 2015

(65) Prior Publication Data

US 2015/0359145 A1 Dec. 10, 2015

Related U.S. Application Data

(63) Continuation of application No. PCT/CN2013/091267, filed on Dec. 31, 2013.

(30) Foreign Application Priority Data

Feb. 21, 2013 (CN) .................. 2013 2 0080561 u (51) Int. Cl.
  *H05K 7/20* (2006.01)
(52) U.S. Cl.
  CPC ....... *H05K 7/20745* (2013.01); *H05K 7/2079* (2013.01); *H05K 7/20145* (2013.01); *H05K 7/20218* (2013.01)

(58) Field of Classification Search
  CPC ........... H05K 7/20736; H05K 7/20572; H05K 7/20836; H05K 7/1488; H05K 7/20145
  See application file for complete search history.

(56) References Cited

U.S. PATENT DOCUMENTS

| | | | |
|---|---|---|---|
| 6,506,111 B2 * | 1/2003 | Sharp | H05K 7/20754 165/122 |
| 8,611,087 B2 * | 12/2013 | Sato | H05K 7/20754 211/26 |

(Continued)

FOREIGN PATENT DOCUMENTS

| | | |
|---|---|---|
| CN | 202257363 U | 5/2012 |
| CN | 102573418 A | 7/2012 |
| CN | 203353016 U | 12/2013 |

OTHER PUBLICATIONS

International Search Report dated Apr. 3, 2014 re: Application No. PCT/CN2013/091267; pp. 1-3.

*Primary Examiner* — Robert J Hoffberg
*Assistant Examiner* — Hung Dang
(74) *Attorney, Agent, or Firm* — Dilworth & Barrese, LLP (57) ABSTRACT

Disclosed are an apparatus for cooling a server cabinet, a server cabinet apparatus, and an Internet data center. The apparatus includes: a bracket and a cooling device; where the bracket is positioned below one or a plurality of server cabinets, and the cooling device is positioned in the bracket, and cools the server cabinet on the bracket. The apparatus for cooling a server is positioned below one or a plurality of server cabinets, such that all the server cabinets in a large-scale Internet data center are effectively cooled, and in addition, resources are saved.

16 Claims, 7 Drawing Sheets

(56) References Cited

U.S. PATENT DOCUMENTS

2008/0055846 A1* 3/2008 Clidaras .................. G06F 1/20
361/679.41
2008/0068791 A1* 3/2008 Ebermann ................ G06F 1/20
361/679.49

* cited by examiner

APPARATUS FOR COOLING SERVER CABINET, SERVER CABINET APPARATUS, AND INTERNET DATA CENTER

CROSS REFERENCE TO RELATED APPLICATIONS

This application is a continuation of International Patent Application Number PCT/CN2013/091267 filed on Dec. 31, 2013 which claims priority to Chinese Patent Application No. 201320080561.8, filed before the Chinese Patent Office on Feb. 21, 2013 and entitled "APPARATUS FOR COOLING SERVER CABINET, SERVER CABINET APPARATUS, AND INTERNET DATA CENTER", all of which said applications are incorporated by reference herein in their entirety.

TECHNICAL FIELD

The present disclosure relates to the field of computers and communications, and in particular, to an apparatus for cooling a server cabinet, a server cabinet apparatus, and an Internet data center.

BACKGROUND

With the rapid development of computer technologies and application of large-scale Internet data centers, electronic devices are becoming more and more highly integrated, and such devices as servers may be directly installed within server cabinets. In this case, the temperature of the server cabinet directly affects the operation performance of the servers. Therefore, in an Internet data center where server cabinets are closely deployed in rows, it is a critical issue as how to cooling the server cabinets to ensure the operation performance of the servers.

Figure 1:
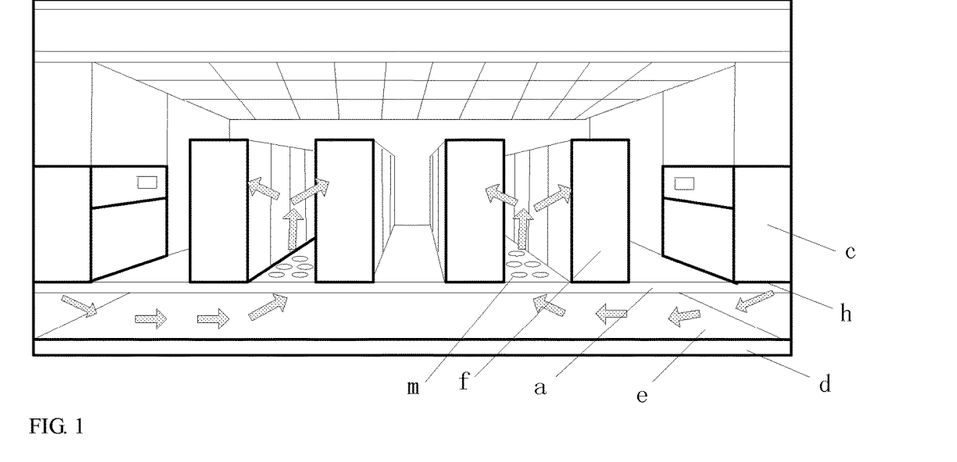
FIG. 1 is a schematic structural view of an apparatus for cooling a server cabinet according to the prior art.

As illustrated in FIG. 1, a related art provides an apparatus for cooling a server cabinet, including: a raised floor a and a support b (not illustrated in FIG. 1). The raised floor a is installed on the ground d via the support b, and a passage e is provided between the raised floor a and the ground d. The apparatus further includes an air-conditioner c implementing bottom-blowing and top-returning. In the telecommunication equipment room where a large-scale Internet data center is deployed, the air-conditioner c is positioned on the raised floor a on one side or both sides of the telecommunication equipment room, and server cabinets f are closely deployed in rows on the raised floor a in the middle of the telecommunication equipment room. The raised floor a below the air-conditioner c is provided with an air-supply outlet h, and the raised floor a between two server cabinets f is provided with a ventilation hole m. The air-conditioner c produces cold air, and the cold air is blown to the passage e between the raised floor a and the ground d via the air-supply outlet h on the raised floor below the air-conditioner c, and then the cold air is blown from the ventilation hole m on the raised floor a to the server cabinets f, thereby cooling the server cabinets f.

During the implementation of the present disclosure, the inventors find that the related art has at least the following problems:

Since air-conditioners are generally deployed at one side or both sides of a telecommunication equipment room, in a large-scale Internet data center, some server cabinets in the telecommunication equipment room may not sufficiently cooled. In addition, there is a large space between the raised floor and the ground, and therefore cold air in the passage is not fully used, resulting in a waste of resources.

SUMMARY

In view of the above, embodiments of the present disclosure provide an apparatus for cooling a server cabinet, a server cabinet, and an Internet data center. The technical solutions are as follows:

In a first aspect, an embodiment of the present disclosure provides an apparatus for cooling a server cabinet, including: a bracket and a cooling device, where the bracket is positioned below one or a plurality of server cabinets, and the cooling device is positioned in the bracket, and cools the server cabinet on the bracket.

In a second aspect, an embodiment of the present disclosure provides an apparatus for cooling a server cabinet, including: a bracket and a cooling device.

The bracket is positioned below one or a plurality of server cabinets, and the cooling device is positioned in the bracket, and cools the server cabinet on the bracket.

The cooling device includes a heat exchanger, a blower, and a first air-ducting plate.

The heat exchanger, the blower, and the first air-ducting plate are sequentially arranged parallelly, the heat exchanger ad the blower are positioned below the server cabinet, and the first air-ducting plate is positioned on an outer side of the server cabinet.

An inner side surface of the first air-ducting plate is a concave curved surface, the inner side surface facing towards the blower.

Optionally, the first air-ducting plate is a flat plate, which is perpendicular to the bracket, and includes a surface facing towards the blower.

The bracket includes a first bracket and a second bracket.

One end surface of the first bracket is connected to one end surface of the second bracket, the server cabinet is positioned on the first bracket, the heat exchanger and the blower are installed in the first bracket, and the first air-ducting plate is installed in the second bracket.

If the inner side surface of the first air-ducting plate is a concave curved surface, a second air-ducting plate is installed in the second bracket, an inner side surface of the second air-ducting plate being a concave curved surface.

A direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate.

One end surface of the third bracket is connected to the other end surface of the second bracket.

In a third aspect, an embodiment of the present disclosure provides a server cabinet apparatus, including at least one server cabinet and an apparatus for cooling a server cabinet according to the first aspect.

In a fourth aspect, an embodiment of the present disclosure provides a server cabinet apparatus, including: a first server cabinet, a second server cabinet, and an apparatus for cooling a server cabinet according to the second aspect, where the first server cabinet is positioned on the first bracket, and the second server cabinet is positioned on a third bracket.

In a fifth aspect, an embodiment of the present disclosure provides an Internet data center, including at least one server cabinet apparatus according to the third or fourth aspect.

According to the embodiments of the present disclosure, a bracket is positioned below one or a plurality of server cabinets, and a cooling device is positioned in the bracket. Therefore, when one or a plurality of server cabinets produces hot air, the hot air is blown to the cooling device, the cooling device cools the hot air to obtain cold air, and the cold air is blown to one or a plurality of server cabinets positioned on the bracket. In this way, one or a plurality of server cabinets correspond to an apparatus for cooling a server cabinet, and the apparatus for cooling a server cabinet is close to one or a plurality of server cabinets, such that all the server cabinets in an Internet data center are effectively cooled. In addition, this short-range air supply manner saves resources.

BRIEF DESCRIPTION OF THE DRAWINGS

For a better understanding of the technical solutions in the embodiments of the present disclosure, the accompanying drawings for illustrating the embodiments are briefly described below. Apparently, the accompanying drawings in the following description illustrate only some embodiments of the present disclosure, and persons of ordinary skill in the art may derive other accompanying drawings based on these accompanying drawings without any creative efforts.

REFERENCE NUMERALS AND DENOTATIONS THEREOF a: raised floor; c: air-conditioner implementing bottom-blowing and top-returning; d: ground; e: passage;

f: server cabinet; h: air-supply outlet; m: ventilation hole;

1: bracket; 2: cooling device; 3: server cabinet, first server cabinet;

11: first bracket; 12: second bracket; 21: heat exchanger; 22: blower; 23: first air-ducting plate;

111: first rectangle frame; 112: second rectangle frame; 113: first vertical rod;

1111: fifth lateral rod; 1112: sixth lateral rod; 1113: first longitudinal rod; 1114: second longitudinal rod;

1121: first lateral rod; 1122: second lateral rod; 1123: third longitudinal rod; 1124: fourth longitudinal rod;

121: third rectangle frame; 122: fourth rectangle frame; 123: second vertical rod;

1211: seventh lateral rod; 1212: eighth lateral rod; 1213: fifth longitudinal rod; 1214: sixth longitudinal rod;

1221: third lateral rod; 1222: fourth lateral rod; 1223: seventh longitudinal rod; 1224: eight longitudinal rod;

3a: server cabinet, second server cabinet; 4: second air-ducting plate; 5: third bracket;

6: heat exchanger; 7: blower;

211: filter mesh; 212: heat-exchanger coil; 213: first supporting framework; 214: second supporting framework;

2131: ninth lateral rod; 2132: tenth lateral rod; 2133: ninth longitudinal rod; 2134: tenth longitudinal rod;

2141: eleventh lateral rod; 2142: twelfth lateral rod; 2143: eleventh longitudinal rod; 2144: twelfth longitudinal rod.

DETAILED DESCRIPTION

To make the objectives, technical solutions, and advantages of the present disclosure clearer, embodiments of the present disclosure are described in detail below with reference to the accompanying drawings.

Figure 2:
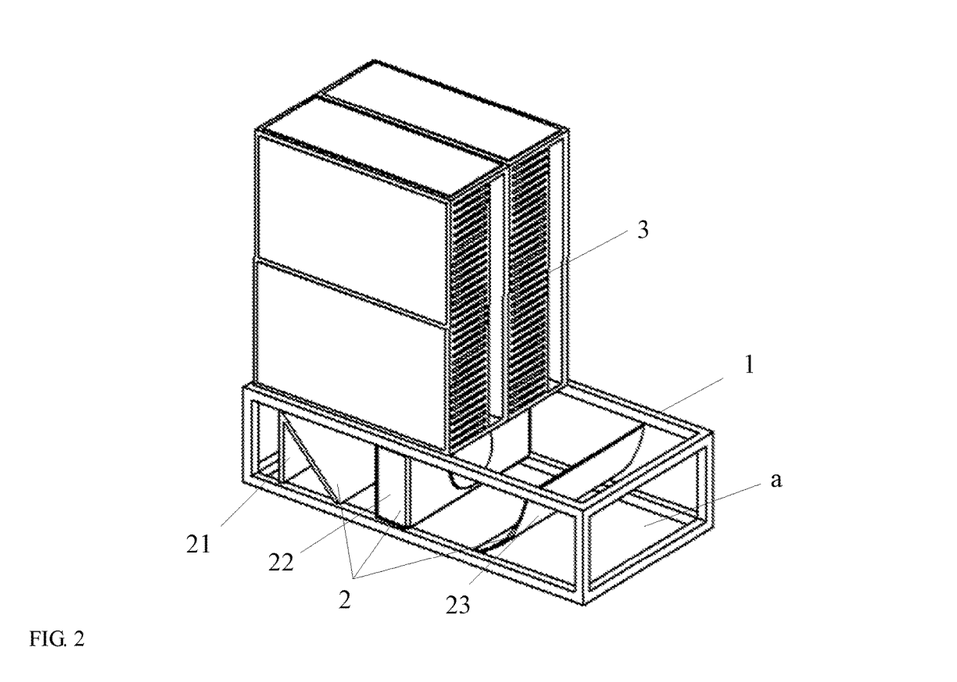
FIG. 2 is a schematic structural view of a server cabinet apparatus according to an embodiment of the present disclosure.

An embodiment of the present disclosure provides an apparatus for cooling a server cabinet. The apparatus may be applied to a server cabinet apparatus as illustrated in FIG. 2, and the server cabinet apparatus includes an apparatus a for cooling a server cabinet a and a server cabinet 3. The apparatus a is positioned below the server cabinet 3.

The apparatus a for cooling a server cabinet comprises: a bracket 1 and a cooling device 2.

The bracket 1 is positioned below one or a plurality of server cabinets 3, and the cooling device 2 is positioned in the bracket 1, and cools the server cabinet 3 on the bracket 1.

The cooling device 2 cools hot air produced by one or a plurality of server cabinets 3 to obtain cold air, and blows the cold air to one or a plurality of server cabinets 3 on the bracket 1, thereby cooling one or a plurality of server cabinets 3.

The bracket 1 is positioned below one or a plurality of server cabinets 3, and the cooling device 2 is positioned in the bracket 1, i.e., a cooling device 2 is disposed below each of one or a plurality of server cabinets 3. Therefore, each or each group of server cabinets has a corresponding cooling device 2 for cooling the server cabinet separately. This prevents the problems that the server cabinets deployed in the middle of the telecommunication equipment room fail to be effectively cooled since the air-conditioners are positioned on sides of the telecommunication equipment room, and that the resources are wasted since the space of the passage between the raised floor and the ground is large and the cold air in the passage is not utilized.

When the bracket 1 is sufficiently large, a plurality of server cabinets 3 may be disposed on the bracket 1, and the cold air blown from the cooling device 2 may be blown to the plurality of server cabinets 3 on the bracket 1.

The cooling device 2 includes a heat exchanger 21, a blower 22, and a first air-ducting plate 23.

The heat exchanger 21, the blower 22, and the first air-ducting plate 23 are sequentially arranged parallelly, the heat exchanger 21 and the blower 21 are positioned below the one or a plurality of server cabinets 3, and the first air-ducting plate 23 is positioned on an outer side of the server cabinet 3.

Figure 3:
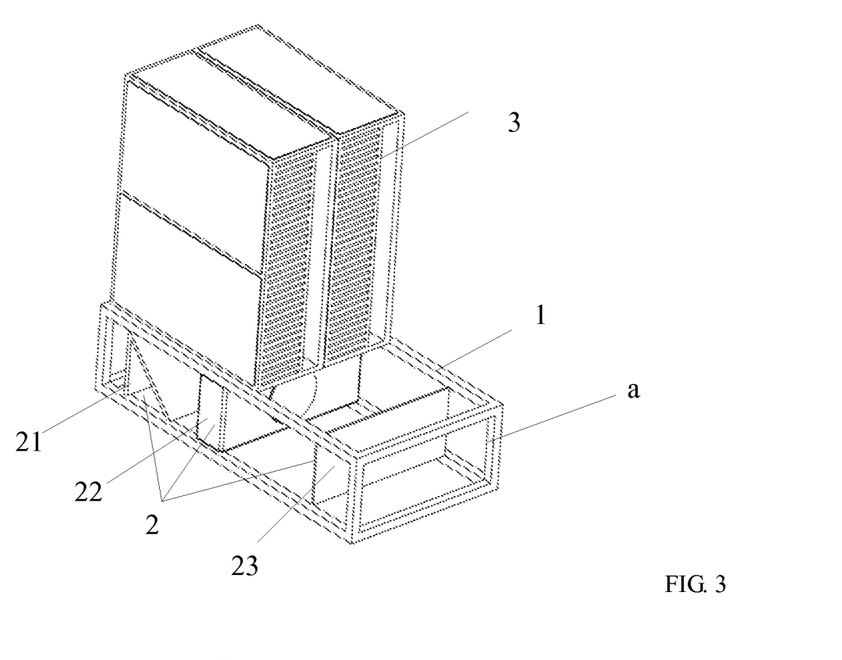
FIG. 3 is a schematic structural view of another server cabinet apparatus according to an embodiment of the present disclosure.

Further, referring to FIG. 2, an inner side surface of the first air-ducting plate 23 is a concave curved surface, the inner side surface facing towards the blower 22; or referring to FIG. 3, the first air-ducting plate 23 is a flat plate, which is perpendicularly installed in the bracket, and includes a surface facing towards the blower 22.

Preferably, the inner side surface of the first air-ducting plate 23 is a concave curved surface, such that the cold air blown from the blower 22 are effectively blown to the server cabinet 3, and thus a small loss may be caused to the cold air blown from the blower 22.

The heat exchanger 21 and the blower 22 are positioned below the one or a plurality of server cabinets 3. The heat exchanger 21 may cools the hot air produced by the one or a plurality of server cabinets 3 to obtain the cold air. The blower accelerates the cold air and blows the cold air to the first air-ducting plate 23. The first air-ducting plate 23 is positioned on the outer side of the one or a plurality of server cabinets 3. When the first air-ducting plate 23 is a concave curved surface, the concave curved surface on the inner side of the first air-ducting plate 23 changes the direction of the cold air, such that the cold air is blown to the one or a plurality of server cabinets 3, thereby effectively cooling the one or a plurality of server cabinets 3. Alternatively, when the first air-ducting plate 23 is a flat plate, and the first air-ducting plate 23 is perpendicularly installed in the bracket 1, under blockage of the first air-ducting plate 23, the cold air is blown to the one or a plurality of server cabinets 3 above the bracket 1, thereby effectively cooling the one or a plurality of server cabinets 3.

Further, in the embodiments of the present disclosure, the bracket 1 may not only include one bracket, but also include a plurality of brackets.

When the bracket 1 includes one bracket, as illustrated in FIG. 2 or FIG. 3, the one or a plurality of server cabinets 3 are positioned on one side of the bracket 1, the heat exchanger 21, the blower 22, and the first air-ducting plate 23 are sequentially arranged in the bracket 1 parallelly. The heat exchanger 21 and the blower 22 are positioned below the one or a plurality of server cabinets 3, and the first air-ducting plate 23 is positioned on the outer side of the one or a plurality of server cabinets 3.

Figure 4:
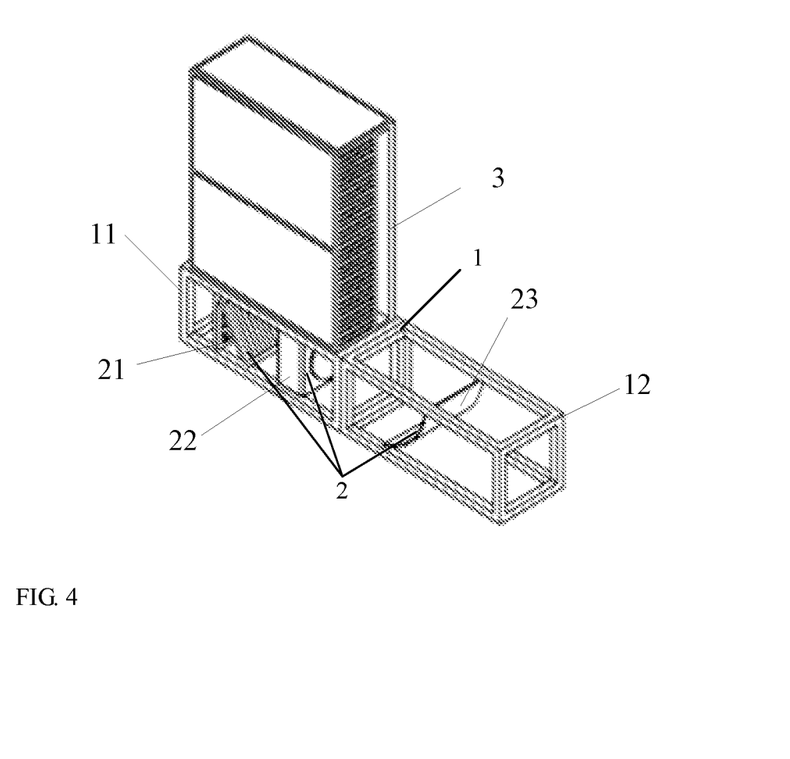
FIG. 4 is a schematic structural view of another server cabinet apparatus according to an embodiment of the present disclosure.

When the bracket 1 includes a plurality of brackets, as illustrated in FIG. 4, the bracket 1 includes a first bracket 11 and a second bracket 12, one end surface of the first bracket 11 is connected to one end surface of the second bracket 12, the server cabinet 3 is positioned on the first bracket 11, the heat exchanger 21 and the blower 22 are installed in the first bracket 11, and the first air-ducting plate 23 is installed in the second bracket. The second bracket 12 is positioned on the outer side of the one or a plurality of server cabinets 3.

The server cabinet 3 blows hot air produced thereby to the heat exchanger 21, the heat exchanger 21 cools the hot air to obtain cold air and blows the cold air to the blower, and the blower 22 accelerates the cold air and blows the cold air to the first air-ducting plate 23. Since the inner side surface of the first air-ducting plate 23 is a concave curved surface, and faces towards the blower 22, the concave curved surface on the inner side of the first air-ducting plate 23 in the second bracket 12 changes the direction of the cold air, and the cold air is blown to the server cabinets 3 on the first bracket 11, thereby effectively cooling the server cabinet 3.

Both the first bracket 11 and the second bracket 12 may be separately manufactured and transported, and the first bracket 11 and the second bracket 12 may be assembled onsite to form the bracket 1, thereby implementing modularized assembling of the bracket 1. Modularization of the cooling device is favorable to integration of the cooling device with the server cabinet, and meanwhile, modular assembling of cooling devices greatly facilitates construction and maintenance of the Internet data center.

Further, the distance between the blower 22 and the heat exchanger 21 falls within a first preset range, the distance between the blower 22 and the first air-ducting plate 23 falls within a second preset range, and the distance between the first air-ducting plate 23 and the server cabinet 3 falls within a third preset range, such that the heat exchanger 21 blows the cold air obtained by cooling to the blower, the blower accelerates the cold air and blows the cold air to the first air-ducting plate 23, and the cold air is blown to the server cabinet 3 via the first air-ducting plate 23.

The first preset range, the second preset range, and the third preset range may be such determined according to the size of the server cabinet 3, the size of the first bracket 11, and the size of the second bracket 12, that it is ensured, by setting the first preset range, the second preset range, and the third preset range, that the cold air obtained by the heat-exchange device 21 reaches, under accelerated operation of the blower 22, the first air-ducting plate 23, and cools the server cabinet 3.

As illustrated in FIG. 2 or FIG. 3, in the apparatus for cooling a server cabinet, using the length of the bracket 1 being 2000 mm as an example, the first preset range is from 400 to 500 mm, the second preset range is from 400 to 600 mm, and the third preset range is from 200 to 300 mm.

As illustrated in FIG. 4, in the apparatus for cooling a server cabinet, when the bracket 1 includes the first bracket 11 and the second bracket 12, assume that the size and shape of the first bracket 11 are the same as those of the second bracket 12, and the length of both the first bracket 11 and the second bracket 12 is 1200 mm, the first preset range may be from 400 to 500 mm, the second preset range may be from 500 to 600 mm, and the third preset range may be from 300 to 400 mm.

Figure 5:
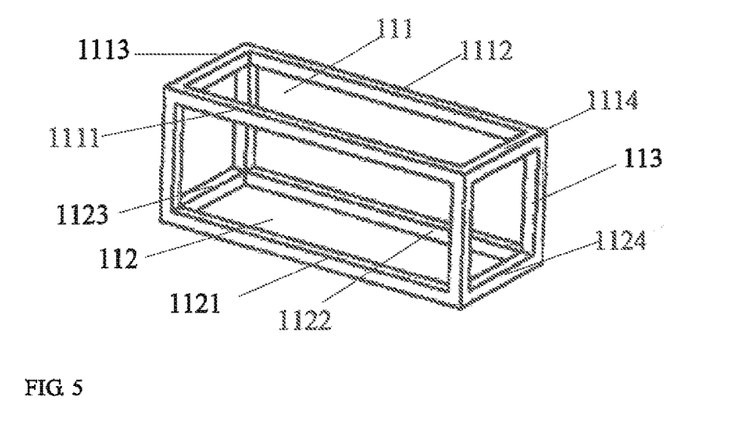
FIG. 5 is a schematic structural view of a first bracket according to an embodiment of the present disclosure.

As illustrated in FIG. 5, the first bracket 11 includes a first rectangle frame 111, a second rectangle frame 112, and four first vertical rods 113, where the size of the first rectangle frame 111 is equal to that of the second rectangle frame 112. One ends of the four vertical rods 113 are respectively connected to the four apex angles of the first rectangle frame 111, and the other ends of the four vertical rods 113 are respectively connected to the four apex angles of the second rectangle frame 112, the first rectangle frame 111 is positioned over the second rectangle frame 112, and the server cabinet 3 is positioned on the first rectangle frame 111.

The first rectangle frame 111 includes a fifth lateral rod 1111, a sixth lateral rod 1112, a first longitudinal rod 1113, and a second longitudinal rod 1114. One end of the fifth lateral rod 1111 is connected to one end of the first longitudinal rod 1113, the other end of the fifth lateral rod 1111 is connected to one end of the second longitudinal rod 1114, one end of the sixth lateral rod 1112 is connected to the other end of the first longitudinal rod 1113, and the other end of the sixth lateral rod 1112 is connected to the other end of the second longitudinal rod 1114. The second rectangle frame 112 includes a first lateral rod 1121, a second lateral rod 1122, a third longitudinal rod 1123, and a fourth longitudinal rod 1124. One end of the first lateral rod 1121 is connected to one end of the third longitudinal rod 1123, the other end of the first lateral rod 1121 is connected to one end of the fourth longitudinal rod 1124. One end of the second longitudinal rod 1122 is connected to the other end of the third longitudinal rod 1123, and the other end of the second lateral rod 1122 is connected to the other end of the fourth longitudinal rod 1124.

Figure 6:
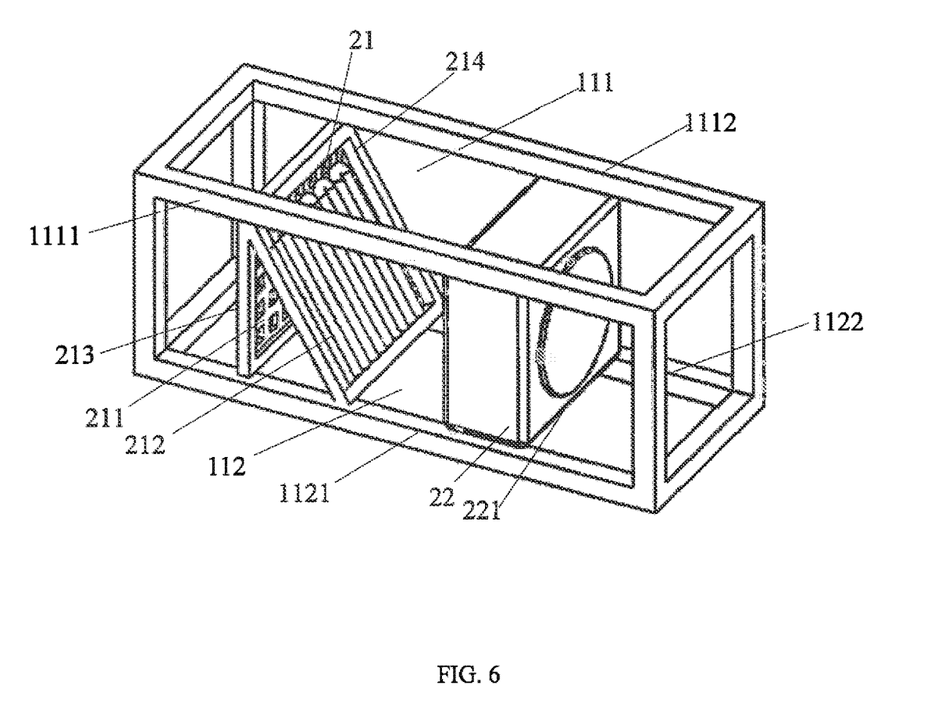
FIG. 6 is a schematic structural view of a heat exchanger and a blower according to an embodiment of the present disclosure.

As illustrated in FIG. 6, the blower 22 is installed on the first lateral rod 1121 and the second lateral 1122 of the second rectangle frame 112, and the heat exchanger 21 is installed on the first lateral rod 1121 and the second lateral rod 1122 of the second rectangle frame 112, and on the fifth lateral rod 1111 and the sixth lateral rod 1112 of the first rectangle frame 111. The heat exchanger 21 cools hot air to obtain cold air, and the blower 22 accelerates the cold air such that the first bracket 11 is not only capable of supporting the server cabinet but also capable of cooling the hot air.

Further, the air outlet of the blower 22 is further provided with a first temperature sensor 221 configured to measure the temperature of the cold air obtained by cooling, and further judge whether the temperature of the cold air reaches a preset temperature.

The height of the blower 22 is smaller than or equal to that of the first bracket 11, the width of the blower 22 is smaller than or equal to that of the first bracket 11. In this way, during maintenance of the blower 22, the blower 22 may be taken out from the front side of the bracket 11 and be maintained.

The number of blowers 22 may be larger than or equal to the number of server cabinets. One blower speed control system is configured for each of the blowers 22. Alternatively, a plurality of blowers 22 may share one blower speed control system.

Figure 7:
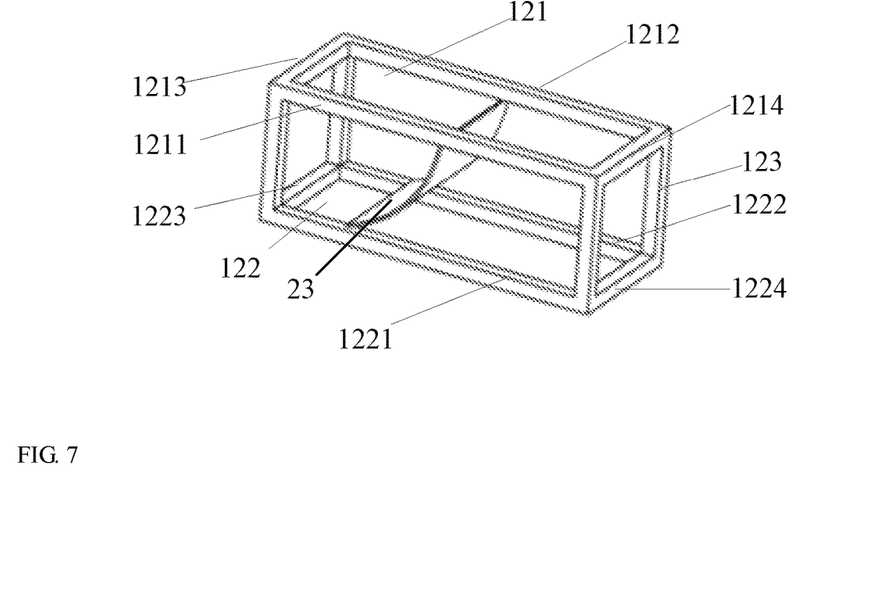
FIG. 7 is a schematic structural view of a second bracket according to an embodiment of the present disclosure.

As illustrated in FIG. 7, the second bracket 12 includes a third rectangle frame 121, a fourth rectangle frame 122, and four second vertical rods 123, where the size of the third rectangle frame 121 is equal to that of the fourth rectangle frame 122. One ends of the four second vertical rods 123 are respectively connected to four apex angles of the third rectangle frame 121, the other ends of the four second vertical rods 123 are respectively connected to four apex angles of the fourth rectangle frame 122, and the third rectangle frame 121 is positioned over the fourth rectangle frame 122.

The third rectangle 121 includes a seventh lateral rod 1211, an eighth lateral rod 1212, a fifth longitudinal rod 1213, and a sixth longitudinal rod 1214. One end of the seventh lateral rod 1211 is connected to one end of the fifth longitudinal rod 1213, the other end of the seventh lateral rod 1211 is connected to one end of the sixth longitudinal rod 1214, one end of the eighth lateral rod 1212 is connected to the other end of the fifth longitudinal rod 1213, and the other end of the eighth lateral rod 1212 is connected to the other end of the sixth longitudinal rod 1214. The fourth rectangle frame 122 includes a third lateral rod 1221, a fourth lateral rod 1222, a seventh longitudinal rod 1223, and an eighth longitudinal rod 1224. One end of the third lateral rod 1221 is connected to one end of the seventh longitudinal rod 1223, the other end of the third lateral rod 1221 is connected to one end of the eighth longitudinal rod 1224, one end of the fourth lateral rod 1222 is connected to the other end of the seventh longitudinal rod 1223, and the other end of the fourth lateral rod 1222 is connected to the other end of the eighth longitudinal rod 1224. The first air-ducting plate is installed on the third lateral rod 1221 and the fourth lateral rod 1222 of the fourth rectangle frame 122, the blower accelerates the cold air and blows the cold air to the first air-ducting plate 23, and the cold air is blown to the server cabinet on the first bracket 11 via the first air-ducting plate 23.

The height of the second bracket 12 installed with the first air-ducting plate 23 may be larger than the height of the first bracket 11, or may be smaller than the height of the first bracket 11, or may be equal to the height of the first bracket 11. Preferably, the height of the second bracket 12 may be equal to that of the first bracket 11.

Figure 8:
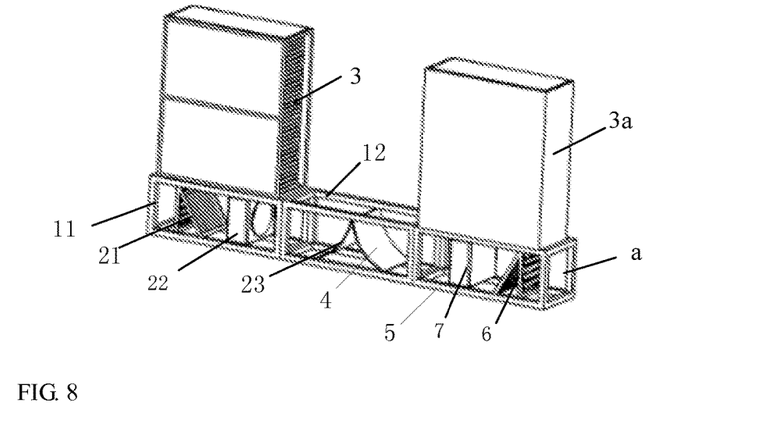
FIG. 8 is a schematic structural view of another server cabinet apparatus according to an embodiment of the present disclosure.

As illustrated in FIG. 8, if the inner side surface of the first air-ducting plate 23 is a concave curved surface, the second bracket 12 may also be installed with a second air-ducting plate 4, where the inner side surface of the second air-ducting plate 4 may also be a concave curved surface. The direction of the concave curved surface of the second air-ducting plate 4 is reverse to the direction of the concave curved surface of the first air-ducting plate 23 such that cold air blown from a third bracket 5 is blown to the second air-ducting plate 4, and the cold air is blown to a server cabinet 3a on the third bracket 5 via the second air-ducting plate 4.

The other end surface of the second bracket is connected to one end surface of the third bracket.

Figure 9:
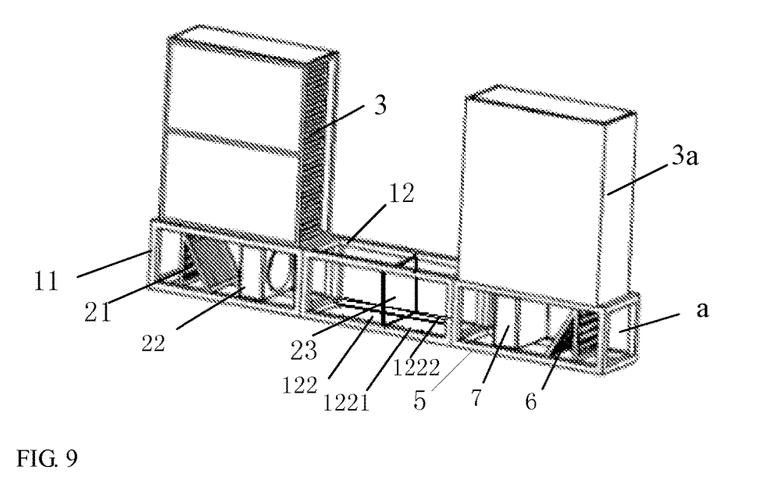
FIG. 9 is a schematic structural view of another server cabinet apparatus according to an embodiment of the present disclosure.

As illustrated in FIG. 9, when the first air-ducting plate 23 is a flat plate, the first air-ducting plate 23 is installed on the third lateral rod 1221 and the fourth lateral rod 1222 of the fourth rectangle frame 122, and the first air-ducting plate 23 is perpendicular to the third lateral rod 1221 and the fourth lateral rod 1222 of the fourth rectangle frame 122. The first air-ducting plate 23 is not only capable of changing the direction of the cold air blown from the blower 22 in the first bracket 11 but also capable of changing the direction of the cold air blown from a blower 7 in the third bracket 5. In this way, the first bracket 11 and the third bracket 5 share the same first air-ducting plate 23, thereby saving materials and space.

As illustrated in FIG. 8, the first bracket 11, the second bracket 12, the heat exchanger 21, the blower 22, and the first air-ducting plate 23 form an apparatus for cooling a server cabinet. The concave curved surface on the inner side of the first air-ducting plate 23 faces towards the blower 22, and a second air-ducting plate 4 may also be installed in the second bracket 2. The second air-ducting plate 4, the third bracket 5, the heat exchanger 6, and the blower 7 form another apparatus for cooling a server cabinet. The direction of the concave curved surface of the second air-ducting plate 4 is reverse to the direction of the concave curved surface of the first air-ducting plate 32. To be specific, the concave curved surface on the inner side of the second air-ducting plate 4 faces towards the blower 7. The heat exchanger 6 cools hot air produced by the server cabinet 3a on the third bracket 5 to obtain cold air, the blower 7 accelerates the cold air and blows the cold air to the second air-ducting plate 4, the second air-ducting plate 4 changes the direction of the cold air and blows the cold air to the server cabinet 3a on the third bracket 5.

When the first air-ducting plate 23 and the second air-ducting plate 4 are simultaneously installed in the second bracket 12, two apparatuses for cooling server cabinets may share the same second bracket 12, thereby saving materials and space.

The structure of the third bracket 5 may be the same as that of the first bracket 11.

The third bracket 5 may include the above-described heat exchanger 6 and blower 7. The heat exchanger 6 in the third bracket 5 cools the hot air produced by the server cabinet 3a on the third bracket 5 to obtain cold air, and blows the cold air to the blower 7. As illustrated in FIG. 8, the blower 7 accelerates the cold air, and blows the cold air to the second air-ducting plate 4 in the second bracket 12, the second air-ducting plate 4 changes the direction of the cold air and blows the cold air to the server cabinet 3a on the third bracket 5. Alternatively, as illustrated in FIG. 9, the blower 7 accelerates the cold air, and blows the cold air to the first air-ducting plate 23 in the second bracket 12, the first air-ducting plate 23 changes the direction of the cold air and blows the cold air to the server cabinet 3a on the third bracket 5. The third bracket 5 may further include an apparatus for cooling hot air produced by other server cabinets as long as cold air is blown from the third bracket 5.

As illustrated in FIG. 6, the heat exchanger 21 includes a filter mesh 211 and a heat-exchanger coil 212. The filter mesh 211 is connected to the heat-exchanger coil 212, and the heat-exchanger coil 212 is positioned on a side facing towards the blower 22.

The top portion of the filter mesh 211 is connected to the top portion of the heat-exchanger coil 212, and the filter mesh 211 and the heat-exchanger coil 212 are such arranged as to form a preset angle.

The preset angle formed between the filter mesh 211 and the heat-exchanger coil 212 may be any angle from 0 to 45 degrees.

Further, as illustrated in FIG. 6, the heat exchanger 21 further includes a first supporting framework 213 and a second supporting framework 214. Two apex angles at one end of the first supporting framework 213 are respectively fixed onto the first lateral rod 1121 and the fifth lateral rod 1111 of the first bracket 11, and two apex angles at the other end of the first supporting framework 213 are respectively fixed onto the second lateral rod 1122 and the sixth lateral rod 1114 of the first bracket 11. Two apex angles at one end of the second supporting framework 214 are respectively fixed onto the first lateral rod 1121 and the fifth lateral rod 1111 of the first bracket 11, and two apex angles at the other end of the second supporting framework 214 are respectively fixed onto the second lateral rod 1122 and the sixth lateral rod 1114 of the first bracket 11. The filter mesh 211 is installed on the first supporting framework 213, and the heat-exchanger coil 212 is installed on the second supporting framework 214. In this way, the filter mesh 211 filters the hot air, and the heat-exchanger coil 212 cools the hot air. In addition, the filter mesh 211 is fixed onto the first supporting framework 213, and the heat-exchanger coil 212 is fixed onto the second supporting framework 214. During maintenance of the heat-exchanger coil, the heat exchanger 21 may be conveniently taken out from the first bracket 11.

Figure 10:
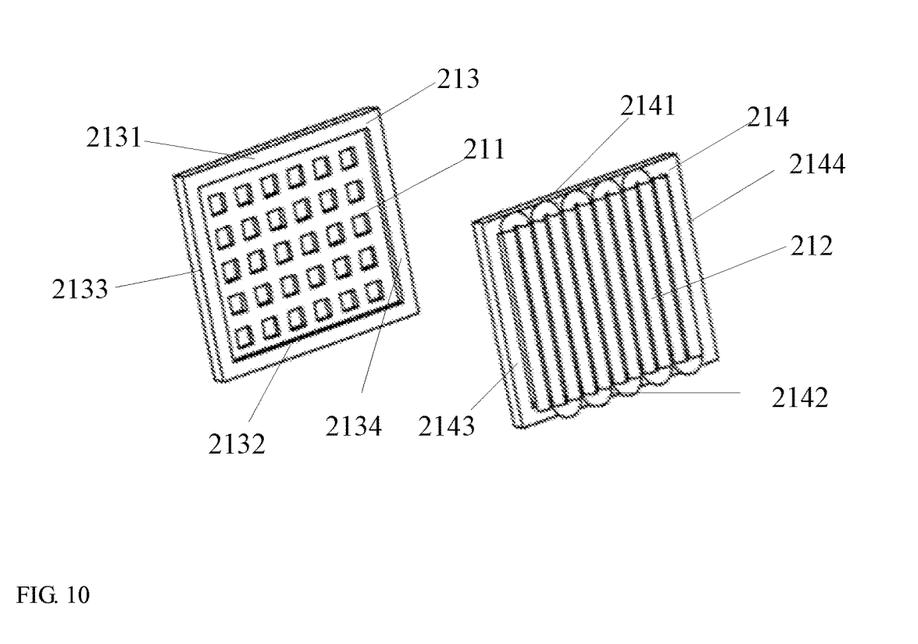
FIG. 10 is a schematic structural view of a first support framework and a second support framework according to an embodiment of the present disclosure.

As illustrated in FIG. 10, the first supporting framework 213 includes a ninth lateral rod 2131, a tenth lateral rod 2132, a ninth longitudinal rod 2133, and a tenth longitudinal rod 2134. One end of the ninth lateral rod 2131 is connected to one end of the ninth longitudinal rod 2133, the other end of the ninth lateral rod 2131 is connected to one end of the tenth longitudinal rod 2134, one end of the tenth lateral rod 2132 is connected to the other end of the ninth longitudinal rod 2133, and the other end of the lateral rod 2132 is connected to the other end of the tenth longitudinal rod 2134. The filter mesh 211 is installed on the first supporting framework 213. The second supporting framework 214 includes an eleventh lateral rod 2141, a twelfth lateral rod 2142, an eleventh longitudinal rod 2143, and a twelfth longitudinal rod 2141. One end of the eleventh lateral rod 2141 is connected to one end of the eleventh longitudinal rod 2143, the other end of the eleventh lateral rod 2141 is connected to one end of the twelfth longitudinal rod 2144, one end of the twelfth lateral rod 2142 is connected to the other end of the eleventh longitudinal rod 2143, and the other end of the twelfth lateral rod 2142 is connected to the other end of the twelfth longitudinal rod 2144. The heat-exchanger coil 212 is fixed onto the second supporting framework 214.

Figure 11:
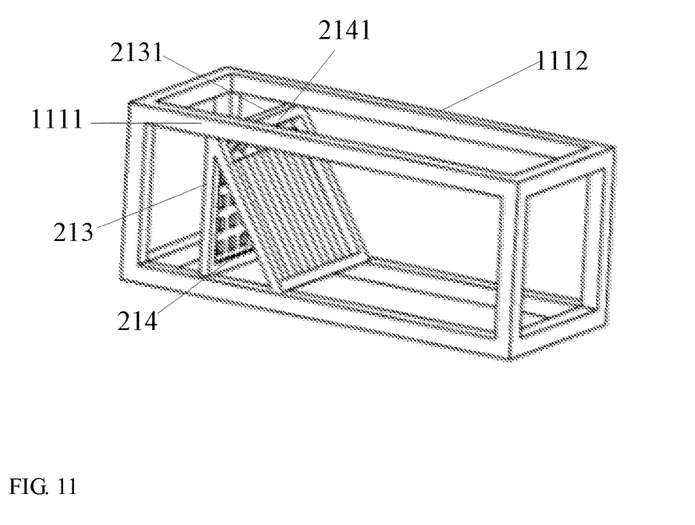
FIG. 11 is a schematic structural view of a heat exchanger according to an embodiment of the present disclosure.

Further, as illustrated in FIG. 11, the ninth lateral rod 2131 of the first supporting framework 213 is fixed between the fifth lateral rod 1111 and the sixth lateral rod 1112 of the first bracket 11, the eleventh lateral rod of the second supporting framework 214 is fixed between the fifth lateral rod 1111 and the sixth lateral rod 1112 of the first bracket 11, the ninth lateral rod 2131 of the first supporting framework 213 may overlap the eleventh lateral rod 2141 of the second supporting framework 214, and the first supporting framework 213 and the second supporting framework 214 are such arranged as to form a preset angle. In this way, the filter mesh 211 installed on the first supporting framework 213 and the blower 22 are parallelly arranged, and the second supporting framework 214 installed with the heat-exchanger coil 212 and the blower 22 are such arranged as to form a preset angle.

When a preset angle is formed between the filter mesh and the heat-exchanger coil, the area of the heat-exchanger coil is larger, thereby better cooling the hot air.

Figure 12:
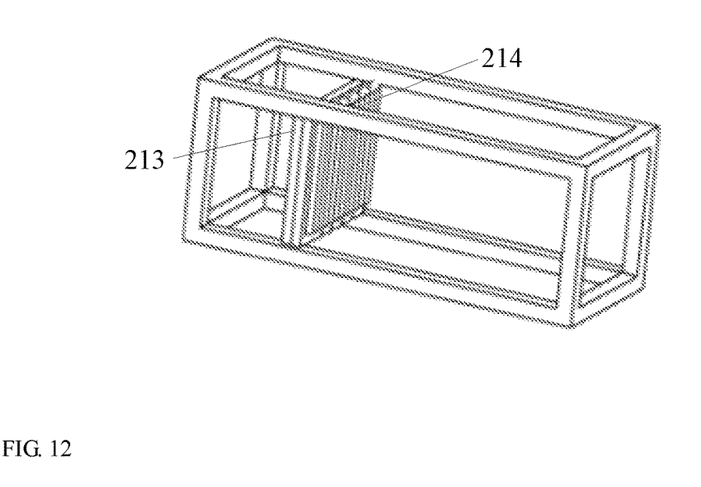
FIG. 12 is a schematic structural view of another heat exchanger according to an embodiment of the present disclosure.

Optionally, a side surface of the filter mesh 211 facing towards the heat-exchanger coil 212 is connected to a side surface of the heat-exchanger coil 212 facing towards the filter mesh 211, and the filter mesh 211 and the heat-exchanger coil 212 are parallelly arranged.

Further, as illustrated in FIG. 12, the second supporting framework 214 installed with the heat-exchanger coil 212, and the blower 22 may be parallelly arranged, such that the first supporting framework 213 and the blower 22 are parallelly arranged, and the heat-exchanger coil 212 and the blower 22 are parallelly arranged.

The height of the first supporting framework 213 is smaller than or equal to that of the first bracket 11, and the height of the second supporting framework 214 is smaller than or equal to that of the first bracket 11. In this way, the heat exchanger 21 may be taken out from a side surface of the first bracket 11 for maintenance.

Optionally, one end of the filter mesh 211 is fixed onto the first lateral rod 1121 and the fifth lateral rod 1111 of the first bracket 11, the other end of the filter mesh 211 is fixed onto the second lateral rod 1122 and the sixth lateral rod 1112 of the first bracket 11, one end of the heat-exchanger coil 212 is fixed onto the first lateral rod 1121 and the fifth lateral rod 1111 of the first bracket 11, and the other end of the heat-exchanger coil 212 is fixed to the second lateral rod 1122 and the sixth lateral rod 1112 of the first bracket. In this way, the filter mesh 211 filters the hot air, and the heat-exchanger coil 212 cools the hot air.

One heat-exchanger coil 212 may use one control system, or a plurality of heat-exchanger coils 212 may use one control system.

Further, the heat exchanger 21 further includes a second temperature sensor, where the second temperature sensor is installed on a side, facing the heat-exchanger coil 212, of the filter mesh 211, and is configured to measure the temperature of the hot air produced by the server cabinet.

Figure 13:
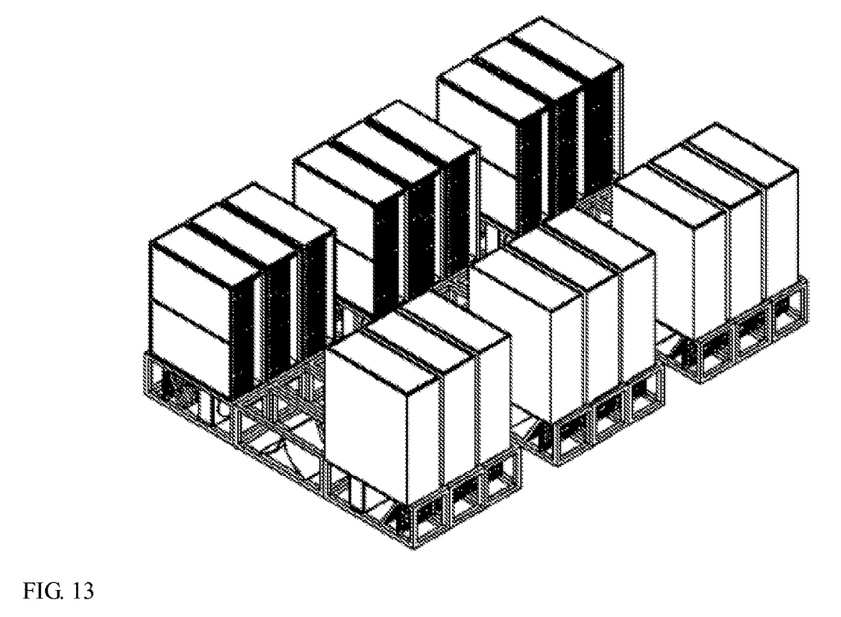
FIG. 13 is a schematic structural view of an Internet data center according to an embodiment of the present disclosure.

A plurality of cooling devices may form a cooling system. The cooling system is applicable to an Internet data center as illustrated in FIG. 13, and the cooling system is positioned below the server cabinet in the Internet data center.

The heat-exchanger, the blower, the filter, and sensor of each of the plurality of cooling devices may share one control system, and an average temperature or maximum temperature mode is employed for cooling control.

The heat-exchanger may employ a refrigerated water mode or a direct expansion mode.

When the heat exchanger employs the refrigerated water mode, all heat-exchanger coils in the system share one water distribution unit, where the water distribution unit serves as a distribution unit at the chief water outlet of the refrigerated water of the system and is responsible for providing distribution interfaces and maintenance interfaces for all the coils in the system.

When the heat exchanger employs the direct expansion mode, one heat-exchanger coil may be controlled by one control system, or a plurality of heat-exchanger coils may be controlled by one control system.

When a cooling system is formed by a plurality of cooling devices, each four to five cooling devices are spaced apart, thereby facilitating inspection and repair of various parts or components of the cooling system.

According to the embodiments of the present disclosure, a bracket is positioned below one or a plurality of server cabinets, and a cooling device is positioned in the bracket. Therefore, when the one or a plurality of server cabinets produce hot air, the hot air is blown to the cooling device, the cooling device cools the hot air to obtain cold air, and the cold air is blown to the one or a plurality of server cabinets positioned on the bracket. In this way, the one or a plurality of server cabinets correspond to an apparatus for cooling a server cabinet, and the apparatus for cooling a server cabinet is close to the one or a plurality of server cabinets, such that all the server cabinets in an Internet data center are effectively cooled. In addition, this short-range air supply manner saves resources.

Referring to FIG. 2 or FIG. 3, an embodiment of the present disclosure provides a server cabinet apparatus, including a server cabinet 3 and an apparatus a for cooling a server cabinet.

The apparatus a for cooling a server cabinet includes: a bracket 1 and a cooling device 2.

The bracket 1 is positioned below one or a plurality of server cabinets 3, and the cooling device 2 is positioned in the bracket 1, and cools the server cabinet 3 on the bracket 1.

Optionally, the cooling device 2 includes a heat exchanger 21, a blower 22, and a first air-ducting plate 23.

The heat exchanger 21, the blower 22, and the first air-ducting plate 23 are sequentially arranged parallelly, the heat exchanger 21 and the blower 21 are positioned below the server cabinet 3, and the first air-ducting plate 23 is positioned on an outer side of the server cabinet 3.

Further, an inner side surface of the first air-ducting plate 23 is a concave curved surface, the inner side surface facing towards the blower 22; or the first air-ducting plate 23 is a flat plate, which is perpendicularly installed in the bracket, and includes a surface facing towards the blower 22.

Optionally, referring to FIG. 4, the bracket 1 includes a first bracket 11 and a second bracket 12.

One end surface of the first bracket 11 is connected to one end surface of the second bracket 12, the server cabinet 3 is positioned on the first bracket 11, the heat exchanger 21 and the blower 22 are installed in the first bracket 11, and the first air-ducting plate 23 is installed in the second bracket 12.

The distance between the blower 22 and the heat exchanger 21 falls within a first preset range, the distance between the blower 22 and the first air-ducting plate 23 falls within a second preset range, and the distance between the first air-ducting plate 23 and the server cabinet 3 falls within a third preset range, such that the heat exchanger 21 blows the cold air obtained by cooling to the blower, the blower accelerates the cold air and blows the cold air to the first air-ducting plate 23, and the cold air is blown to the server cabinet 3 via the first air-ducting plate 23.

Optionally, the air outlet of the blower 22 may be provided with a first temperature sensor.

Optionally, referring to FIG. 8, if the inner side surface of the first air-ducting plate 23 is a concave curved surface, a second air-ducting plate 4 is installed in the second bracket 12, an inner side surface of the second air-ducting plate 4 being a concave curved surface.

The direction of the concave curved surface of the second air-ducting plate 4 is reverse to the direction of the concave curved surface of the first air-ducting plate 23, such that cold air blown from a third bracket 5 is blown to the second air-ducting plate 4, and the cold air is blown to a server cabinet 3a on the third bracket 5 via the second air-ducting plate 4.

One end surface of the third bracket 5 is connected to the other end surface of the second bracket 12.

Optionally, the heat exchanger 21 includes a filter mesh 211 and a heat-exchanger coil 212, where the filter mesh 211 is connected to the heat-exchanger coil 212, and the heat-exchanger coil 212 is positioned on a side facing towards the blower 22.

Optionally, referring to FIG. 11, the top portion of the filter mesh 211 is connected to the top portion of the heat-exchanger coil 212, and the filter mesh 211 and the heat-exchanger coil 212 are such arranged as to form a preset angle.

Optionally, referring to FIG. 12, a side surface of the filter mesh 211 facing towards the heat-exchanger coil 212 is connected to a side surface, facing towards the filter mesh 211, of the heat-exchanger coil 212, and the filter mesh 211 and the heat-exchanger coil 212 are parallelly arranged.

Optionally, the heat exchanger 21 further includes a second temperature sensor, where the second temperature sensor is installed on the side of the filter mesh 211 which side faces towards the heat-exchanger coil 212.

According to the embodiments of the present disclosure, a bracket is positioned below one or a plurality of server cabinets, and a cooling device is positioned in the bracket. Therefore, when the one or a plurality of server cabinets produces hot air, the hot air is blown to the cooling device, the cooling device cools the hot air to obtain cold air, and the cold air is blown to the one or a plurality of server cabinets positioned on the bracket. In this way, the one or a plurality of server cabinets correspond to an apparatus for cooling a server cabinet, and the apparatus for cooling a server cabinet is close to the one or a plurality of server cabinets, such that all the server cabinets in an Internet data center are effectively cooled. In addition, this short-range air supply manner saves resources.

Referring to FIG. 8 or FIG. 9, an embodiment of the present disclosure provides a server cabinet apparatus, including: a first server cabinet 3, a second server cabinet 3a, and an apparatus a for cooling a server cabinet. The first server cabinet 3 is positioned on the first bracket 11, and the second server cabinet 3a is positioned on the third bracket 5.

The apparatus a for cooling a server cabinet includes: a bracket and a cooling device.

The bracket is positioned below one or a plurality of server cabinets, and the cooling device is positioned in the bracket, and cools the server cabinet on the bracket.

Further, the cooling device includes a heat exchanger 21, a blower 22, and a first air-ducting plate 23.

The heat exchanger 21, the blower 22, and the first air-ducting plate 23 are sequentially arranged parallelly, the heat exchanger 21 and the blower 22 are positioned below the server cabinet 3, and the first air-ducting plate 23 is positioned on an outer side of the first server cabinet 3.

An inner side surface of the first air-ducting plate 23 is a concave curved surface, the inner side surface facing towards the blower 22; or the first air-ducting plate 23 is a flat plate, which is perpendicularly installed in the bracket, and includes a surface facing towards the blower 22.

Further, the bracket includes a first bracket 11 and a second bracket 12.

One end surface of the first bracket 11 is connected to one end surface of the second bracket 12, the first server cabinet 3 is positioned on the first bracket 11, the heat exchanger 21 and the blower 22 are installed in the first bracket 11, and the first air-ducting plate 23 is installed in the second bracket 12.

Further, if the inner side surface of the first air-ducting plate 23 is a concave curved surface, a second air-ducting plate 4 is installed in the second bracket 12, an inner side surface of the second air-ducting plate 4 being a concave curved surface. The direction of the concave curved surface of the second air-ducting plate 4 is reverse to the direction of the concave curved surface of the first air-ducting plate 23, such that cold air blown from a third bracket 5 is blown to the second air-ducting plate 4, and the cold air is blown to a second server cabinet 3a on the third bracket 5 via the second air-ducting plate 4.

One end surface of the third bracket 5 is connected to the other end surface of the second bracket 12.

According to the embodiments of the present disclosure, a bracket is positioned below one or a plurality of server cabinets, and a cooling device is positioned in the bracket. Therefore, when the one or a plurality of server cabinets produces hot air, the hot air is blown to the cooling device, the cooling device cools the hot air to obtain cold air, and the cold air is blown to the one or a plurality of server cabinets positioned on the bracket. In this way, the one or a plurality of server cabinets correspond to an apparatus for cooling a server cabinet, and the apparatus for cooling a server cabinet is close to the one or a plurality of server cabinets, such that all the server cabinets in an Internet data center are effectively cooled. In addition, this short-range air supply manner saves resources.

Referring to FIG. 13, an embodiment of the present disclosure provides an Internet data center, including at least one server cabinet apparatus according to the embodiment as illustrated in FIG. 2 or FIG. 3 or a server cabinet apparatus according to the embodiment illustrated in FIG. 8 or FIG. 9.

According to the embodiments of the present disclosure, a bracket is positioned below one or a plurality of server cabinets, and a cooling device is positioned in the bracket. Therefore, when the one or a plurality of server cabinets produces hot air, the hot air is blown to the cooling device, the cooling device cools the hot air to obtain cold air, and the cold air is blown to the one or a plurality of server cabinets positioned on the bracket. In this way, the one or a plurality of server cabinets correspond to an apparatus for cooling a server cabinet, and the apparatus for cooling a server cabinet is close to the one or a plurality of server cabinets, such that all the server cabinets in an Internet data center are effectively cooled. In addition, this short-range air supply manner saves resources.

Described above are merely exemplary embodiments of the present disclosure, but are not intended to limit the present disclosure. Any modification, equivalent replacement, or improvement made without departing from the spirit and principle of the present disclosure should fall within the protection scope of the present disclosure.

The invention claimed is:

1. An apparatus for cooling a server cabinet, comprising: a bracket and a cooling device; wherein
   the bracket is positioned below one or a plurality of server cabinets, and the cooling device is positioned in the bracket, and cools the server cabinet on the bracket;
   the cooling device comprises a heat exchanger, a blower, and a first air-ducting plate; the heat exchanger, the blower, and the first air-ducting plate are sequentially arranged in parallel, the heat exchanger and the blower is positioned below the server cabinet, and the first air-ducting plate is positioned on an outer side of the server cabinet;
   the bracket comprises a first bracket and a second bracket; wherein
   one end surface of the first bracket is connected to one end surface of the second bracket, the server cabinet is positioned on the first bracket, the heat exchanger and the blower are installed in the first bracket, and the first air-ducting plate is installed in the second bracket.

2. The apparatus according to claim 1, wherein an inner side surface of the first air-ducting plate is a concave curved surface, the inner side surface facing towards the blower.

3. The apparatus according to claim 1, wherein the first air-ducting plate is a flat plate, which is perpendicular to the bracket, and comprises a surface facing towards the blower.

4. The apparatus according to claim 1, wherein a distance between the blower and the heat exchanger falls within a first preset range, a distance between the blower and the first air-ducting plate falls within a second preset range, and a distance between the first air-ducting plate and the server cabinet falls within a third preset range, such that the heat exchange blows the cold air obtained by cooling to the blower, the blower accelerates to blow the cold air to the first air-ducting plate, and the cold air is blown to the server cabinet via the first air-ducting plate.

5. The apparatus according to claim 4, wherein an air outlet of the blower is further provided with a first temperature sensor.

6. The apparatus according to claim 1, wherein when the inner side surface of the first air-ducting plate is a concave curved surface, the second bracket comprises a second air-ducting plate, an inner side surface of the second air-ducting plate being a concave curved surface;
   wherein a direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate;
   wherein one end surface of the third bracket is connected to the other end surface of the second bracket.

7. The apparatus according to claim 1, wherein the heat exchanger comprises a filter mesh and a heat-exchanger coil, the filter mesh being connected to the heat-exchanger coil, and the heat-exchanger coil being positioned on a side facing towards the blower.

8. The apparatus according to claim 7, wherein a top portion of the filter mesh is connected to a top portion of the heat-exchanger coil, and the filter mesh and the heat-exchanger coil are such arranged as to form a preset angle.

9. The apparatus according to claim 7, wherein a side surface of the filter mesh facing towards the heat-exchanger coil is connected to a side surface of the heat-exchanger coil facing towards the filter mesh, and the filter mesh and the heat-exchanger coil are arranged in parallel.

10. The apparatus according to claim 7, wherein the heat exchanger further comprises a second temperature sensor, the second temperature sensor being installed on the side of the filter mesh which side faces towards the heat-exchanger coil.

11. A server cabinet apparatus, comprising: at least one server cabinet and an apparatus for cooling the server cabinet; wherein
the apparatus for cooling the server cabinet comprises: a bracket and a cooling device; wherein
the bracket is positioned below one or a plurality of the server cabinets, and the cooling device is positioned in the bracket, and cools the server cabinet on the bracket;
the cooling device comprises a heat exchanger, a blower, and a first air-ducting plate; the heat exchanger, the blower, and the first air-ducting plate are sequentially arranged in parallel, the heat exchanger and the blower is positioned below the server cabinet, and the first air-ducting plate is positioned on an outer side of the server cabinet;
the bracket comprises a first bracket and a second bracket; wherein
one end surface of the first bracket is connected to one end surface of the second bracket, the server cabinet is positioned on the first bracket, the heat exchanger and the blower are installed in the first bracket, and the first air-ducting plate is installed in the second bracket.

12. The server cabinet apparatus according to claim 11, wherein the at least one server cabinet comprises a first server cabinet and a second server cabinet;
the heat exchanger and the blower is positioned below the first server cabinet, and the first air-ducting plate is positioned on an outer side of the first server cabinet;
an inner side surface of the first air-ducting plate is a concave curved surface, the inner side surface facing towards the blower;
the first server cabinet is positioned on the first bracket;
the second bracket further comprises a second air-ducting plate, an inner side surface of the second air-ducting plate being a concave curved surface;
wherein a direction of the concave curved surface of the second air-ducting plate is reverse to a direction of the concave curved surface of the first air-ducting plate, such that cold air blown from a third bracket is blown to the second air-ducting plate, and the cold air is blown to the second server cabinet on the third bracket via the second air-ducting plate;
wherein one end surface of the third bracket is connected to the other end surface of the second bracket.

13. The server cabinet apparatus according to claim 11, wherein the at least one server cabinet comprises a first server cabinet and a second server cabinet;
the heat exchanger and the blower is positioned below the first server cabinet, and the first air-ducting plate is positioned on an outer side of the first server cabinet;
the first air-ducting plate is a flat plate, which is perpendicular to the bracket, and comprises a surface facing towards the blower;
the first server cabinet is positioned on the first bracket;
cold air blown from a third bracket is blown to the first air-ducting plate, and the cold air is blown to the second server cabinet on the third bracket via the first air-ducting plate;
wherein one end surface of the third bracket is connected to the other end surface of the second bracket.

14. An Internet data center, comprising at least one server cabinet apparatus; wherein
the server cabinet apparatus comprises: at least one server cabinet and an apparatus for cooling the server cabinet; wherein
the apparatus for cooling the server cabinet comprises: a bracket and a cooling device; wherein
the bracket is positioned below one or a plurality of the server cabinets, and the cooling device is positioned in the bracket, and cools the server cabinet on the bracket;
the cooling device comprises a heat exchanger, a blower, and a first air-ducting plate; the heat exchanger, the blower, and the first air-ducting plate are sequentially arranged in parallel, the heat exchanger and the blower is positioned below the server cabinet, and the first air-ducting plate is positioned on an outer side of the server cabinet;
the bracket comprises a first bracket and a second bracket; wherein
one end surface of the first bracket is connected to one end surface of the second bracket, the server cabinet is positioned on the first bracket, the heat exchanger and the blower are installed in the first bracket, and the first air-ducting plate is installed in the second bracket.

15. The Internet data center according to claim 14, wherein the at least one server cabinet comprises a first server cabinet and a second server cabinet;
the heat exchanger and the blower is positioned below first the server cabinet, and the first air-ducting plate is positioned on an outer side of the first server cabinet; and
an inner side surface of the first air-ducting plate is a concave curved surface, the inner side surface facing towards the blower;
the first server cabinet is positioned on the first bracket;
the second bracket further comprises a second air-ducting plate, an inner side surface of the second air-ducting plate being a concave curved surface; wherein
a direction of the concave curved surface of the second air-ducting plate is reverse to a direction of the concave curved surface of the first air-ducting plate, such that cold air blown from a third bracket is blown to the second air-ducting plate, and the cold air is blown to the second server cabinet on the third bracket via the second air-ducting plate;
wherein one end surface of the third bracket is connected to the other end surface of the second bracket.

16. The Internet data center according to claim 14, wherein the at least one server cabinet comprises a first server cabinet and a second server cabinet;
the heat exchanger and the blower is positioned below the first server cabinet, and the first air-ducting plate is positioned on an outer side of the first server cabinet;
the first air-ducting plate is a flat plate, which is perpendicular to the bracket, and comprises a surface facing towards the blower;
the first server cabinet is positioned on the first bracket;

cold air blown from a third bracket is blown to the first air-ducting plate, and the cold air is blown to the second server cabinet on the third bracket via the first air-ducting plate;

wherein one end surface of the third bracket is connected to the other end surface of the second bracket.

* * * * *